United States Patent [19]

Pfennings et al.

[11] Patent Number: 4,775,806

[45] Date of Patent: Oct. 4, 1988

[54] INTEGRATED CIRCUIT HAVING CAPACITIVE PROCESS-SCATTER COMPENSATION

[75] Inventors: Leonardus C. M. G. Pfennings; Hendrikus J. M. Veendrick; Adrianus T. Van Zanten, all of Eindhoven, Netherlands

[73] Assignee: U.S. Philips Corporation, New York, N.Y.

[21] Appl. No.: 935,488

[22] Filed: Nov. 26, 1986

[30] Foreign Application Priority Data

Dec. 3, 1985 [NL] Netherlands ............... 8503331

[51] Int. Cl.⁴ .............. H03K 3/356; H03K 4/58; H03K 17/14; H03K 17/16

[52] U.S. Cl. .............. 307/296 R; 307/482; 307/578; 307/279; 307/585

[58] Field of Search ............ 307/270, 450, 451, 452, 307/469, 475, 499–501, 570, 571, 579, 584, 585, 304, 296 R, 297, 578, 482; 340/783–788, 794; 350/332, 333

[56] References Cited

U.S. PATENT DOCUMENTS

| | | | |
|---|---|---|---|
| 3,636,378 | 1/1972 | Chashi et al. ............ | 307/304 X |
| 4,176,289 | 11/1979 | Leach et al. ............ | 307/578 X |
| 4,400,636 | 8/1983 | Andrade ............ | 307/450 X |
| 4,450,369 | 5/1984 | Schuermeyer ............ | 307/475 X |
| 4,451,744 | 5/1984 | Adam ............ | 307/297 |
| 4,498,021 | 2/1985 | Uya ............ | 307/270 X |
| 4,499,416 | 2/1985 | Koike ............ | 307/297 X |
| 4,506,164 | 3/1985 | Higuchi ............ | 307/270 X |
| 4,567,381 | 1/1986 | Piasecki ............ | 307/296 R |
| 4,649,291 | 3/1987 | Konishi ............ | 307/297 |
| 4,677,314 | 6/1987 | Shirato et al. ............ | 307/270 |

OTHER PUBLICATIONS

Fink et al, *Electronics Engineers' Handbook*, pp. 16-15 to 16-18, McGraw-Hill, 1982.

*Primary Examiner*—Stanley D. Miller
*Assistant Examiner*—David R. Bertelson
*Attorney, Agent, or Firm*—Thomas A. Briody; Algy Tamoshunas; Steven R. Biren

[57] ABSTRACT

In integrated circuits the delay of the signal transitions has to lie within specified limits. This delay is partly determined by variations in the manufacturing process (process scatter). To compensate for the effect of this scatter a load capacitance is connected via a switching element to a node which is to be influenced in the integrated circuit. The switching element receives a reference voltage which is dependent on the manufacturing process and is generated by reference source, so that the node capacitance 26 is connected to the node for a longer or shorter time, depending on the process scatter.

15 Claims, 2 Drawing Sheets

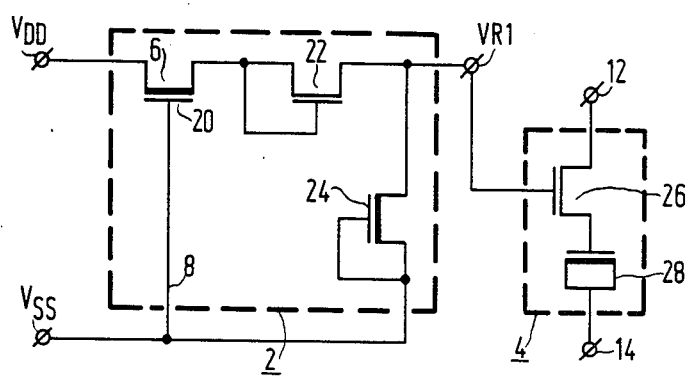
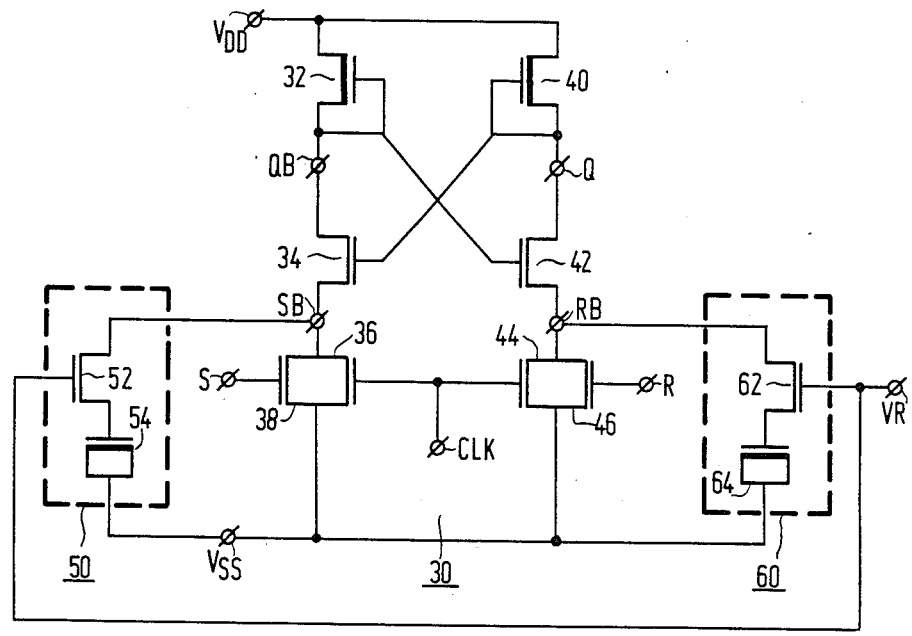
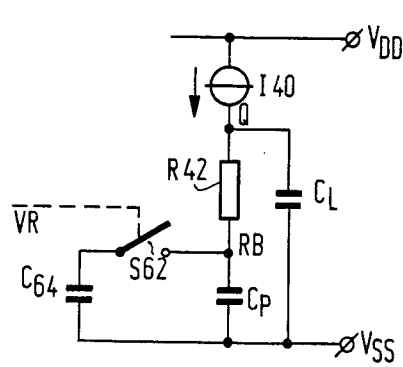
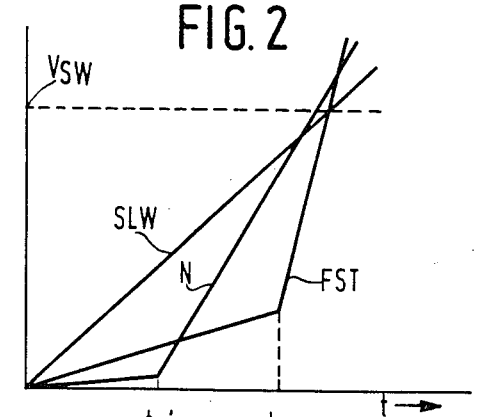
FIG. 1
FIG. 2
FIG. 3
FIG. 4

INTEGRATED CIRCUIT HAVING CAPACITIVE PROCESS-SCATTER COMPENSATION

BACKGROUND OF THE INVENTION

The invention relates to an integrated circuit containing a load capacitance. The invention also relates to an integrated reference source. In integrated circuits the delay of signal transitions has to lie within specified limits. This delay is partly caused by the internal delay in the signal-transferring gates. It is sometimes necessary to increase the delay of the gates artificially in order to meet the required specifications. It is generally known that signal transitions can be delayed by loading suitable nodal points in the gates with a load capacitance, which prevents rapid changes of voltage at the nodes. In the manufacture of integrated circuits it is necessary, however, to take account of process scatter, which may cause uncertainty in the prediction of internal delay values. At the same time the design of the circuit must be such that the signal transitions in a circuit manufactured under "worst-case" conditions as well as in the circuit manufactured uuder "best-case" conditions fall within the specified limits. This proves to be a particularly complicated problem in the design of an integrated circuit, since the delaying affect of a load capacitance increases with increasing internal delay in the gates (and with increasing internal output resistance, which determines the delay) so that the influence of the load capacitance depends to a very great extend on the unavoidable variations in the manufacturing process. Typical prior art circuits in this area are shown in U.S. Pat. Nos. 4,250,412 and 4,280,070, as well as European Pat. Nos. 23,798 and 47,128.

SUMMARY OF THE INVENTION

It is an object of the invention to provide an integrated circuit of the kind mentioned above, in which the total signal-transition delay is less dependent on variations in manufacturing process.

To that end an integrated circuit in accordance with the invention has the characteristic that the circuit contains a reference source for generating a reference voltage dependent on the manufacturing process, which reference voltage drives a switching element connected in series with the load capacitance. The switching element regulates the magnitude of the load which the capacitance constitutes for the loaded node. If the load capacitance is required to make a large contribution to the total signal-transition delay, then the switching element is driven by the reference voltage in such a way that the capacitance loads the node during almost the entire signal transition. In the opposite case the process-dependent reference voltage drives the switching element in such a way that the capacitance loads the node for only a short time or is even permanently isolated from the node.

In an initial embodiment of an integrated circuit in accordance with the invention the circuit contains insulated-gate field-effect transistors, the load capacitance consisting of a field-effect transistor connected as a capacitance, and the switching element being a further field-effect transistor, which receives the reference voltage on its gate. The invention is particularly suited for application in MOS circuits. A MOS transistor can be connected in a simple manner as a capacitance, while a further MOS transistor can be switched into the conductive and non-conductive states by making the control voltage higher or lower than the threshold voltage.

It is advantageous to use an enhancement-type transistor as the transistor serving as the switching element, since a transistor of this type can in a simple manner be kept in the non-conductive state, which is desirable for some purposes. It is further advantageous to use a depletion-type transistor as the transistor serving as a capacitance, since this type possesses over a relatively large voltage range a constant capacitance between the gate and the short-circuited conduction channel. In a CMOS circuit it is often not possible to use a depletion-type transistor. The preference in this case is for a P-MOS transistor whose main current-carrying electrodes are connected to the highest supply voltage, since a transistor connected in this way also shows a constant capacitance over a relatively large voltage range. It is also advantageous to make the reference voltage in a CMOS circuit independent of the supply voltage, since the supply voltages have a considerable influence on the signal-transition delays.

The invention further relates to a reference source for generating a reference voltage, which reference source contains field-effect transistors, with the characteristic that the reference voltage is dependent on the manufacturing process and is mainly determined by the threshold voltages of the manufactured field-effect transistors. The manufacturing process is sufficiently characterized by the threshold voltages of the different types of transistors, since these threshold voltages are essentially partly determined by the internal delays of the gate configuration. A reference source for the above-described dependence on the manufacturing process is simple to design and generates a reference voltage that can adequately control a switch.

In a preferred embodiment of a reference source according to the invention, the reference source contains a depletion-type field-effect transistor in which a first side of the channel is connected to a first supply terminal and the gate is connected to a biasing point, and in which a second side of the channel is provided with a series arrangement of N (N$>=$1) enhancement-type field-effect transistors connected in the conductive direction as a diode, which series arrangement is connected via a load element to a second supply terminal. A small current, determined by the load element, flows through the series-connected channels of the depletion and enhancement-type field-effect transistors. The gate voltage of the depletion-type transistor will consequently be almost equal to the threshold voltage, so that the voltage on the channel side not connected to the supply terminal will also be a threshold voltage above the voltage on the biasing point. The (N) enhancement-type transistor or transistors circuited as a diode or diodes will lower this voltage by the amount (N times) of its or their threshold voltage. The biasing point can be connected to a reference voltage of a similar reference source, resulting in a chain of reference sources. It is advantageous if for at least one reference source the gate of the depletion-type transistor is connected to the second supply terminal, so that the generated reference voltages relate to this supply terminal.

BRIEF DESCRIPTION OF THE DRAWING

The invention will now be explained with reference to the following figures, in which:

FIG. 1 shows an exemplary embodiment of an integrated circuit according to the invention;

FIG. 2 shows an application of the invention in an N-MOS circuit;

FIG. 3 shows an equivalent circuit of a branch of the N-MOS circuit;

FIG. 4 shows a signal diagram;

DESCRIPTION OF THE PREFERRED EMBODIMENTS

Figure 5:
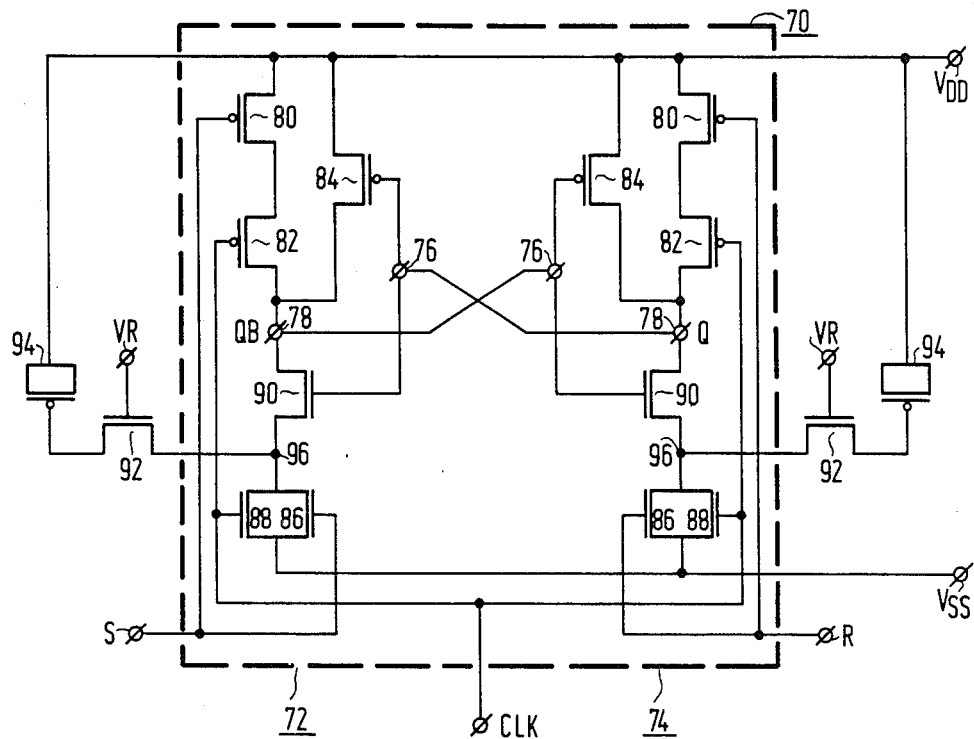
FIG. 5 shows an application of the invention in a CMOS circuit.

FIG. 1 gives an exemplary embodiment of an integrated circuit according to the invention, which circuit contains a reference source 2 and a load 4 provided with a series-connected switching element 26 with a load capacitance 28. The reference source 2 is provided with a reference output VR1 for generating a reference voltage which is dependent on the manufacturing process and which drives the switching element 26.

The reference source 2 contains a series arrangement of a depletion transistor 20, an enhancement transistor 22 connected as a diode and a depletion transistor 24 connected as a current source, which serves as load element. The depletion transistor 20 is connected on one side 6 of its channel to a first supply terminal $V_{DD}$, while its gate 8 is connected to a second supply terminal $V_{SS}$. Since the current source 24 allows a small current to flow through the series arrangement, the voltage on the gate of transistor 22 is almost equal to the threshold voltage $V_{TD}$ of the depletion transistor 20. The voltage on the reference output VR1 is a threshold voltage $V_{TE}$ of the enhancement field-effect transistor 22 lower. The load 4 forms a process-dependent load between its terminals 12 and 14 and can be connected to a circuit not shown in the figure. If a manufactured integrated circuit is relatively slow, due to a relatively small threshold voltage $V_{TD}$ for the depletion transistors and a relatively high threshold voltage $V_{TE}$ for the enhancement transistors, then the reference voltage $V_{TD} - V_{TE}$ will be small, so that the transistor 26 will become non-conductive when there is only a small voltage across the load capacitance 28, as a consequence of which the load exerted by 4 will be of short duration.

If the integrated circuit to be loaded is relatively fast, due to process scatter, the duration of the load exerted by 4 will be long. If desired, the voltage on the reference output VR1 can be made more strongly dependent on the process scatter. When for example an extra enhancement transistor is connected as a diode between the enhancement transistor 22 and the depletion transistor 20, then the reference voltage will be equal to $V_{TD} - 2 \times V_{TE}$. The reference voltage VR1 can be increased with a threshold voltage $V_{TD}$ of a depletion transistor by, for example, adding a depletion transistor whose gate is connected to the second supply terminal $V_{SS}$ and whose channel is connected between the first supply terminal $V_{DD}$ and the gate 8 of the depletion transistor 20. An extra load element between the gate 8 and the second supply terminal $V_{SS}$ allows a small bias current to flow through the added depletion transistor, so that the voltage at the biasing point is equal to the threshold voltage $V_{TD}$ and the reference voltage VR1 is equal to $2 \times V_{RD} - V_{TE}$.

Generally speaking, an arbitrary biasing voltage $V_B$, whether or not process-dependent, can be connected to the gate 8 of the depletion transistor 20, causing the reference voltage to change by the same value $V_B$. In this manner it is always possible to generate an adequate reference voltage for a switching element, such as for example the enhancement transistor 26.

It will be evident that the invention can be implemented optionally in N-MOS, P-MOS as well as C-MOS circuits.

FIG. 2 shows an application of the invention in an N-MOS memory circuit 30 (a so-called latch).

The latch 30 receives at a clock input CLK a clock signal, whereby a high clock signal ("1") switches the latch 30 into the memory state and a low clock signal ("0") switches the latch 30 into the read-in state. In the latter state an information bit can be read into the latch 30 by means of feeding signals to the SET and RESET inputs S and R. After some time the inverting and non-inverting output QB and Q accept the output voltage belonging to the read-in information bit.

For this purpose the latch 30 contains a first and a second current branch, the first branch containing a first field-effect transistor 32 of the depletion type with its conduction channel connected between a first supply terminal $V_{DD}$ and the inverting output QB, the gate being connected to the latter output. The first current branch further contains an internal node SB which is connected to the inverting output QB via the channel of a second field-effect transistor 34 of the enhancement type and is connected to the second supply terminal $V_{SS}$ via the parallel channels of a third and a fourth field-effect transistor 36 and 38 of the enhancement type. The gate of the third transistor 36 receives the clock signal while the gate of the fourth field-effect transistor 38 is connected to the SET input S.

The second current branch contains a fifth field-effect transistor 40 of the depletion type, which interconnects the first supply terminal $V_{DD}$ and the non-inverting output Q, its gate being connected to the latter output. The second current branch contains an internal node RB which is connected via the conduction channel of a sixth field-effect transistor 42 of the depletion type to the non-inverting output Q and to the second supply terminal $V_{SS}$ via the parallel channels of a seventh and eighth field-effect transistor 44 and 46 of the enhancement type. The gate of the seventh field-effect transistor 44 receives the clock signal CLK, while the gate of the eighth transistor 46 is connected to the RESET input R. The gate of the second field-effect transistor 34 is connected to the non-inverting output Q while the gate of the sixth field-effect transistor 42 is connected to the inverting output QB.

When the clock signal is high the latch 30 is in the memory state: the third and the seventh field-effect transistors are in the conductive state, so that the two internal nodes SB and RB are conductively connected to the second supply terminal $V_{SS}$.

The memory circuit, formed by the first, second, fifth and sixth field-effect transistors 32, 34, 40 and 42 holds the information bit stored in it. When the clock signal goes from high to low, the latch 30 switches to the read-in state. The signals at the SET-S and RESET input R determine the information bit to be read in. When a high signal is at the SET input S and a low signal is at the RESET input R, a "1" is read in (that is to say the non-inverting output Q goes high); when a low signal is at the SET input S and a high signal is at the RESET input R an "0" is read in (that is to say the non-inverting output Q goes low).

A latch of this type can be used as a control device in an output stage of an integrated circuit, in which the outputs Q and QB drive the powerful output transistors, possibly via interposed amplifier stages.

The latch 30 in this case is provided with two loads of the kind earlier described, a first load 50 being connected between the input node SB and the second supply terminal $V_{SS}$, and a second load 60 being connected between the internal node RB and the same supply terminal. The loads 50 and 60 each contain a series arrangement of a depletion field-effect transistor 54 and 64, respectively, connected as a capacitance, and an enhancement field-effect transistor 52 and 62, respectively, serving as switching element, whose gate receives the reference voltage VR, which may for example be generated by a reference source of the earlier described type.

The operation of the latch 30 will be explained with reference to the following example, where it is assumed that a "1" is read in (the RESET input R is low) while the latch 30 receives an "0" (the output Q is low).

FIG. 3 shows an equivalent circuit diagram of a branch of the latch acting as a switch as described in the foregoing example. The branch contains a current source I40 (equivalent to the fifth field-effect transistor 40) which connects the first supply terminal $V_{DD}$ to the non-inverting output Q, which output drives a capacitive load CL. The output Q is connected via a very small resistance R42 (equivalent to the channel resistance of the conducting sixth field-effect transistor 42) to the internal node RB, which, with a small parasitic capacitance Cp, is connected to the second supply terminal. A switching element S62 (equivalent to the field-effect transistor 62 in the second load 60), which is driven by the reference voltage VR, switches a load capacitance C64 (the field-effect transistor 64 connected as a capacitance) to the internal node RB. The capacitances C64, Cp and CL are discharged, since the output Q is low. The switching element S62 plays an important role in the switching from "low" to "high". If the latch 30 is relatively slow due to the process scatter, then the reference voltage VR is so low that the switching element S62 is permanently open, so that the current source I40 is loaded only by the capacitances Cp and CL. The output voltage VQ on the output Q rises at a constant speed to the high level, as indicated by SLW in the graph shown in FIG. 4. If the latch 30 is relatively fast, due to process scatter, then the switching element S62 is closed until the voltage on the capacitance C64 becomes equal to the high reference voltage VR minus a threshold voltage $V_{TE}$ of the transistor 62 serving as switching element. This is indicated by FST in the graph shown in FIG. 4. Up to the moment $t_1$ the switching element S62 is closed; the current source I40 charges up all three capacitances CL, Cp and C64. The high reference voltage VR and the low threshold voltage $V_{TE}$ determine the moment t at which the switching element S62 opens (the transistor 62 is non-conductive), after which the two capacitances CL and Cp are charged up quickly to the high output level by the powerful current source I40. The form of the output voltage VQ when the latch has a nominal delay is indicated by N in the graph shown in FIG. 4. Up to the moment $t_1'$ the switching element S62 is closed; all three capacitances CL, Cp and C64 are charged up. This charging, however, takes place more slowly than in a fast latch, since the current source I40 carries less current. After the moment $t_1'$ the switching element S62 is opened, so that only the two capacitances CL and Cp are charged up, although not so quickly as in the fast latch.

A control circuit like the current branch in FIG. 3 can be designed in such a way that the process variations have no influence on the time needed to reach the switch-over point VSW of the next circuit. In addition, this circuit has the advantage that the steepness of the signal transition can under certain circumstances be maximum after the moment $t_1$ or $t_1'$, respectively. This property means that a following driven circuit need only be in the transition region between a "high" and a "low" input signal for a short time, so that the dissipated power for the next circuit remains minimal.

FIG. 5 shows an application of the invention in a CMOS circuit, in which the arrangement chosen as an Example is a so-called "CMOS translation" of the latch 30 in FIG. 2.

The circuit contains a latch 70 with a first and a second current branch 72 and 74, each containing an input node and an output node 76 and 78, the output node 76 being connected to the first supply terminal $V_{DD}$ via the series-connected conduction channels of a first and a second P-MOS transistor 80 and 82, respectively, and the conduction channel of a third P-MOS transistor 84 connected in parallel with this series arrangement. The output node 78 is further connected to the second supply terminal $V_{SS}$ via the parallel-connected conduction channels of a first and a second NMOS transistor 86 and 88, respectively, and the conduction channel of a third NMOS transistor 90 connected in series with it.

The gates of the second P and NMOS transistors 82 and 88 are connected to the clock input CLK; the gates of the third P and NMOS transistors 84 and 90 are connected to the input node 76 and the gates of the first P and NMOS transistors 80 and 86 are connected in the first current branch 72 to the SET input S and in the second current branch 74 to the RESET input R. Each current branch is further provided with a PMOS transistor 94 connected as a capacitance, the main electrodes being connected to the first supply voltage $V_{DD}$ and the gate being connected via the conduction channel of an NMOS transistor 92, serving as switching element, to a node 96 of the conduction channels of the first, second and third NMOS transistors 86, 88 and 90. The input node 76 of the first current branch 72 is connected to the output node 78 of the second current branch 74 and vice versa. The gates of the transistors 92, serving as switches, in the first and second current branches 72 and 74 receive the same reference voltage VR. The operation of the latch 70 corresponds to the operation of the latch 30 in FIG. 2, except that the output node 78 of the first current branch 72 corresponds to the inverting output QB in FIG. 2 and the output node 78 of the second current branch corresponds to the non-inverting output Q shown in the same figure.

The equivalent circuit diagram of a current branch for the latch 30 in FIG. 3 applies equally to the latch 70 in FIG. 5, with the difference that the current source I40 can better be replaced by a resistance corresponding to an impedance, formed by the series arrangement of the first and second PMOS transistors 80 and 82, between the first supply terminal $V_{DD}$ and the non-inverting output Q. It will be clear that the charging current for the capacitances $C_{64}$, $C_p$ and $C_L$ is in this case highly dependent on the supply voltages, so that compensation must be provided by the reference voltage received by the transistors 92 (FIG. 5) serving as switching elements.

Figure 6:
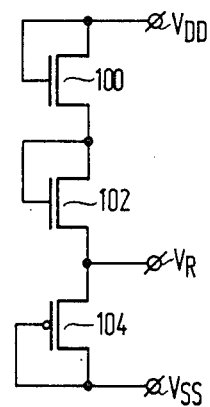
FIG. 6 shows a preferred reference source for a CMOS circuit.

An example of a reference source, shown in FIG. 6, generates a reference voltage $V_R = V_{DD} - 2V_{TE}$ that is strongly dependent on the supply voltages and compensates their influence on the signal-transition delay. Through the series arrangement of two NMOS transistors 100 and 102, connected as diodes, runs a small current determined by the relatively small PMOS transistor 104, which is used for generating the reference voltage VR. If the supply voltage $V_{DD}$ increases, the reference voltage VR will also increase, so that the transistors 92 (FIG. 5) serving as switching elements will load the latch 70 longer with the transistors 94 connected as a capacitance. In this way the same effect is obtained as illustrated in FIG. 4.

What is claimed is:

1. An integrated circuit comprising at least one logic gate circuit having at least one node, which is to be charged and discharged under the control of a logic signal, a reference voltage-controlled switching element, a capacitance coupled to said node via said reference voltage-controlled switching element, and control means for supplying said reference voltage as a function of the manufacturing process to compensate for a manufacturing process-induced spread in charge and discharge times of said node.

2. An integrated circuit as claimed in claim 1, comprising insulated gate field-effect transistors, the capacitance comprising a depletion type field-effect transistor connected as a capacitor, and the switching element comprising an enhancement type field-effect transistor receiving the reference voltage on its gate.

3. An integrated circuit as claimed in claim 2, comprising, between a first and second supply terminal, a first and a second current branch mutually cross-coupled via a respective transistor, having a conduction channel in the respective current branch, whereby at least one current branch comprises a series arrangement of conduction channels of transistors, each interconnecting node between a pair of conduction channels in said series arrangement being connected via a switching element to an additional capacitance, each switching element receiving the same reference voltage.

4. An integrated circuit as claimed in claim 3, wherein the circuit contains a first and a second current branch, the first current branch containing a first field-effect transistor of the depletion type of which the conduction channel is connected between a first supply terminal and an inverting output, and second through eighth field-effect transistors, the gate of said first transistor being connected to said output, and in which the first current branch further contains a first internal node which is connected via the conduction channel of said second field-effect transistor of the enhancement type to the inverting output and via parallel channels of said third and a fourth field-effect transistor of the enhancement type to a second supply terminal, the gate of the third transistor receiving the clock signal and the gate of the fourth field-effect transistor being connected to a first input, the second current branch containing said fifth field-effect transistor of the depletion type which connects the first supply terminal to a non-inverting output, its gate being connected to the latter output; the second current branch further containing a second internal node, which is connected via the conduction channel of said sixth field-effect transistor of the depletion type to the non-inverting output and is connected via parallel channels of said seventh and eighth field-effect transistors of the enhancement type to the second supply terminal, the gate of the seventh field-effect transistor receiving the clock signal and the gate of the eighth transistor being connected to a second input, the gate of the second field-effect transistor further being connected to the non-inverting output and the gate of the sixth field-effect transistor being connected to the inverting output, the first and the second internal node each being connected to the second supply terminal via a series arrangement of a ninth field-effect transistor serving as the additional capacitance and a tenth field-effect transistor serving as the switching element.

5. An integrated circuit as claimed in claim 2, 3 or 4, the control means comprising a depletion type field-effect upper transistor, having a first main electrode connected to a high voltage supply terminal and having a gate electrode connected to a low voltage supply terminal, at least one diode-connected enhancement type field-effect transistor having a conduction channel inserted in a path between a second main electrode of the upper transistor and a resistive load element that is connected to the low voltage supply terminal, the reference voltage being transmitted on an output terminal between the load element and the diode-connected transistor.

6. An integrated circuit as claimed in claim 2, 3 or 4, the control means comprising a depletion type field-effect upper transistor, having a first main electrode connected to high voltage supply terminal and having a gate electrode connected to a low voltage supply terminal, at least one diode-connected enhancement type field-effect transistor having a conduction channel inserted in a path between a second main electrode of the upper transistor and a resistive load element that is connected to the low voltage supply terminal, the reference voltage being transmitted on an output terminal between the load element and the diode-connected transistor, the resistive load element comprising a further depletion type field-effect transistor connected as a current source.

7. An integrated circuit as claimed in claim 1, comprising complementary insulated gate field-effect transistors, the additional capacitance comprising a P-channel field-effect transistor having its main electrodes coupled to the higher of two circuit supply voltages, the switching element comprising a N-channel field-effect transistor receiving the reference voltage on its gate.

8. An integrated circuit as claimed in claim 7, comprising a first and a second current branch between a first and second supply terminal and mutually cross-coupled via a respective transistor having its conduction channel inserted in the respective current branch, whereby at least one current branch comprises a series arrangement of conduction channels of transistors, each interconnecting node between a pair of conduction channels in said series arrangement being connected via a relative switching element to an additional capacitance, each switching element receiving the same reference voltage.

9. An integrated circuit as claimed in claim 8, comprising complementary field-effect transistors, whereby the circuit comprises a first and a second current branch, each of which contains an input and an output node, the output node being connected to a first supply terminal via the series connected conduction channels of a respective first and a respective second PMOS transistor and the conduction channel of a respective third PMOS transistor connected in parallel to this series arrangement, the output node further being connected to the second supply terminal $V_{SS}$ via the parallel-connected conduction channels of a respective first and a respective second NMOS transistor and the conduction channel of a respective third NMOS transistor connected in series thereto, the gates of the second PMOS and NMOS transistors being connected to a clock input; the gates of the third PMOS and NMOS transistors are connected in the first current branch to a SET input and in the second current branch to a RESET input, each current branch further being provided with a PMOS transistor serving as a capacitance, its main electrodes being connected to the first supply voltage and its gate being connected via the conduction channel of an NMOS transistor serving as a switching element to the conduction channels of the first, second and third NMOS transistors, the input node of the first current branch being connected to the output node of the second current branch and the input node of the second current branch being connected to the output node of the first current branch, the gates of the transistor serving as switching elements being interconnected for receiving the reference voltage.

10. An integrated circuit as claimed in claim 7, 8 or 9, the control means comprising, between a high voltage supply terminal and a reference voltage output, a series arrangement of at least one diode-connected N-channel field-effect transistor, and a resistive load element, connected between said reference voltage output and a low voltage supply terminal.

11. An integrated circuit as claimed in claim 10, the control means comprising, between a high voltage supply terminal and a reference voltage output, a series arrangement of at least one diode-connected N-channel field-effect transistor and connected between said reference voltage output and a low voltage supply terminal a diode-connected P-channel field-effect transistor.

12. Control means for generating a process-dependent reference voltage, comprising a depletion type field-effect upper transistor, having a first main electrode connected to high voltage supply terminal and having a gate electrode connected to a low voltage supply terminal, at least one diode-connected enhancement type field-effect transistor having a conduction channel inserted in a path between a second main electrode of the upper transistor and a resistive load element connected to the low voltage supply terminal, the reference voltage being transmitted on an output terminal between the load element and the diode-connected transistor.

13. Control means for generating a process-dependent reference voltage as claimed in claim 12, the resistive load element comprising a further depletion type field-effect transistor connected as a current source.

14. Control means for generating a process-dependent reference voltage comprising, between a high voltage supply terminal and a reference voltage output, a series arrangement of at least one diode-connected N-channel field-effect transistor, and a resistive load element, connected between said reference voltage output and a low voltage supply terminal.

15. Control means for generating a process-dependent reference voltage as claimed in claim 14 the resistive load element comprising a diode-connected P-channel field-effect transistor.

* * * * *